United States Patent
Mikus et al.

(10) Patent No.: US 6,447,912 B1
(45) Date of Patent: Sep. 10, 2002

(54) COATED CEMENTED CARBIDE CUTTING TOOL AND METHOD OF COATING IT WITH DIAMOND

(75) Inventors: Marian Mikus, Skärholmen; Ingrid Reineck, Huddinge, both of (SE)

(73) Assignee: Sandvik AB, Sandviken (SE)

(*) Notice: Subject to any disclaimer, the term of this patent is extended or adjusted under 35 U.S.C. 154(b) by 0 days.

(21) Appl. No.: 09/581,626
(22) PCT Filed: Dec. 18, 1998
(86) PCT No.: PCT/SE98/02381
§ 371 (c)(1),
(2), (4) Date: Aug. 24, 2000
(87) PCT Pub. No.: WO99/31292
PCT Pub. Date: Jun. 24, 1999

(30) Foreign Application Priority Data

Dec. 18, 1997 (SE) ................................................ 9704742

(51) Int. Cl.⁷ ............................................. C23C 16/26
(52) U.S. Cl. .................. 428/408; 427/532; 427/557; 428/325; 428/697; 428/698; 428/699; 428/336; 51/307; 51/309
(58) Field of Search .............................. 428/698, 408, 428/325, 657, 699, 336; 427/532, 527; 51/307, 309

(56) References Cited

U.S. PATENT DOCUMENTS

| | | | | |
|---|---|---|---|---|
| 4,731,296 A | * | 3/1988 | Kikuchi et al. | 428/408 |
| 4,830,886 A | | 5/1989 | Cho et al. | 427/249 |
| 4,843,039 A | | 6/1989 | Akesson et al. | 501/87 |
| 5,100,703 A | | 3/1992 | Saijo et al. | 427/249 |
| 5,391,422 A | * | 2/1995 | Omori et al. | 428/408 |
| 5,585,176 A | * | 12/1996 | Grab et al. | 428/699 |
| 5,716,170 A | * | 2/1998 | Kammermeier et al. | 407/119 |
| 5,725,932 A | * | 3/1998 | Iio et al. | 428/698 |
| 5,891,522 A | * | 4/1999 | Olson | 427/535 |

FOREIGN PATENT DOCUMENTS

| | | |
|---|---|---|
| EP | 0 500 253 A1 | 8/1992 |
| EP | 0 701 006 A1 | 3/1996 |
| EP | 0 759 480 A1 | 2/1997 |
| WO | WO 95/12009 | 5/1995 |
| WO | WO 95/15258 | 6/1995 |

\* cited by examiner

Primary Examiner—Archene Turner
(74) Attorney, Agent, or Firm—Burns, Doane, Swecker & Mathis, LLP

(57) ABSTRACT

According to the present invention there is now provided a body of cemented carbide provided with at least one wear resistant layer, which body contains a zone in the cemented carbide and adjacent to the applied layer, containing triangular WC platelets with a specific orientation. Different binder phase gradients are possible. The body is in particular suited for application of CVD diamond layers.

24 Claims, 6 Drawing Sheets

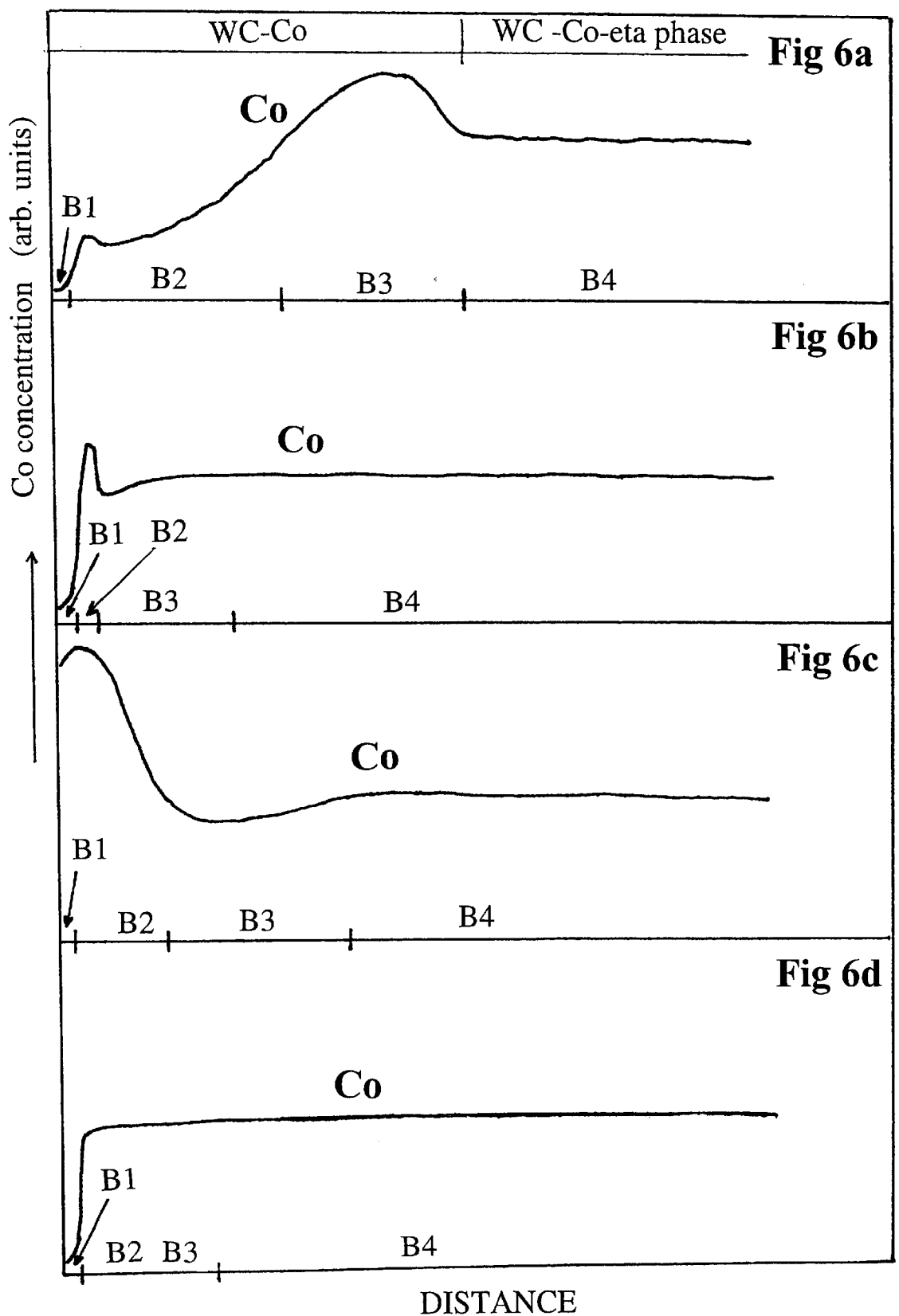

COATED CEMENTED CARBIDE CUTTING TOOL AND METHOD OF COATING IT WITH DIAMOND

FIELD OF THE INVENTION

The present invention relates to coated cemented carbide cutting tools with improved properties obtained by a heat treatment of the cemented carbide before the application of a wear resistant coating. More particulary, the invention is in particular related to a body coated with diamond. However, the invention can also be used for other wear resistant coatings, such as any CVD- or PVD wear resistant coatings.

BACKGROUND OF THE INVENTION

The adhesion of wear resistant coatings on cemented carbide is due to several mechanisms of which mechanical adhesion constitutes one part, i.e. a rough surface grips mechanically into the applied coating. Several approaches have been made in order to achieve good mechanical adhesion see EP-A-500 253. For the case of diamond layers, the achievement of adhesion is particularly difficult since the presence of binder metal deteriorates the adhesion. A common method for achieving good diamond layer adhesion on cemented carbide is to etch away the binder metal from a surface region, see EP-A-0 500 253. This, however, increases the risk of bad adhesion due to loosely bound carbide grains. Other methods involve carburising sintering of an eta phase containing body (U.S. Pat. No. 4,843,039) so as to deplete a surface region of binder phase. The treatment gives a relatively brittle surface zone together with a likewise brittle core which is less than adequate for certain toughness demanding cutting applications.

Another method for preparing a cemented carbide for diamond coating is described in WO 95/15258 according to which a rough surface is obtained through a heat treatment in $N_2$ containing atmosphere. The surfaces treated in this way are free of binder phase. However, during a heat treatment as described in WO 95/15258 grain growth occurs not only at the surface but also within the body generally resulting in formation of large WC-grains in the structure.

U.S. Pat. No. 4,830,886 describes a method to avoid the presence of the eta phase layer formed during a CVD deposition of a TiCN layer by carburizing the eta phase layer through the TiCN-layer after the CVD process.

EP-A-759 480 describes a cemented carbide body containing triangular WC-platelets. The platelets are oriented with their triangular surfaces parallel to the surface of the body. The toughness of the body is said to be improved.

U.S. Pat. No. 5,100,703 describes a diamond-coated sintered body, comprising a film of diamond and/or diamond-like carbon deposited on the surface of a sintered body of a hard phase composed mainly of a mixture of $W_2C$ and WC and inevitable impurities.

SUMMARY OF THE INVENTION

It has now surprisingly been found that within a surface zone of a cemented carbide body, a controlled change in WC grain orientation, size and shape can be obtained by an initial decarburization or decarburization+heat treatment in neutral gas atmosphere or vacuum through which an eta phase containing surface zone is obtained and then a complete recarburization of said zone in order to completely transform the eta phase therein to WC+Co. (Eta phase is a common name for low carbon content containing carbides usually comprising W—Co—C in proportions ($M_6C$ or $M_{12}C$, M=W and Co and/or Fe and/or Ni) such as $M_{12}C=Co_6W_6C$ and $M_6C=Co_3W_3C$, $W_4Co_2C$). The shape of the WC grains is triangular platelets. The platelet containing region can be combined with different binder phase gradient zones. The adhesion of a subsequently deposited wear resistant coating to this body is found to be excellent.

According to one aspect, the present invention provides a body of cemented carbide comprising 4–12 wt-% binder phase coated with at least one wear resistant layer, the body comprises a surface zone with a thickness up to 100 $\mu$m, the zone comprises essentially triangular WC platelets having a texture coefficient ratio >1.75.

According to another aspect, the present invention provides a method for producing diamond coated cemented carbide body with a surface zone in the cemented carbide being different from the rest of the carbide body, the method comprising: decarburizing the body to form an eta phase containing surface zone 3–100 $\mu$m thick and comprising >60% by volume of at least partially interconnected eta phase and recarburizing the body whereby the eta phase is completely transformed into WC+Co.

BRIEF DESCRIPTION OF THE DRAWINGS

FIG. 4a shows in 3000X a scanning electron micrograph of an uncoated WC—Co cemented carbide surface according to the invention but with a different binder phase distribution compared to FIG. 3a.

FIG. 4b shows in 1750X a scanning electron micrograph of the cross-section the body in FIG. 4a.

FIG. 5b shows a in 1500X a scanning electron micrograph of a cross-section of the body in FIG. 5a.

FIGS. 6a–6d show examples of various binder phase distributions together with position of zones B1–B4 obtained after carburizing treatment.

DETAILED DESCRIPTION OF PREFERRED EMBODIMENTS

In one method according to the present invention, a cemented carbide body is first decarburized to form a surface zone of eta phase, for example $Co_6W_6C$, $Co_3W_3C$, A1+A2. This eta phase containing surface zone shall be 3–100 $\mu$m thick and consist of at least partially interconnected eta phase. The amount of eta phase shall be >60% by volume within the zone.

In a preferred embodiment the surface zone A1 contains no WC phase.

The decarburization is made by heating the bodies to a temperature between 900 and 1350° C., preferably between 950 and 1250° C., in a decarburizing atmosphere such as $H_2+H_2O$. The time for the treatment is preferably 1–10 h. Decarburization at lower temperatures-between 950 and 1000° C. gives more even thickness of the decarburized zones comprising eta phase along the entire surface of the treated bodies. Decarburization performed at higher temperatures i.e.—between 1200 and 1250° C., gives thicker decarburized zones comprising eta phase at the edges and corners than at the plane faces of the bodies.

Prior to the carburizing heat treatment, phases other than eta phase, if present, such as W, $Co_7W_6$, shall be transformed to eta phase in the surface zone. This may be done in a separate heat treating step at elevated temperature 1050–1350° C. and in a neutral gas atmosphere or vacuum, during which W and $Co_7W_6$ phases react with carbon present in the cemented carbide and form eta phase, preferably $M_6C$ phase.

In an alternative method, oxidation of the body can be made whereby the preferred treatment comprises the following steps:

Step 1: Heat treatment at 500–900° C. in air, $CO_2$ or $O_2$, preferably air whereby oxides such as $WO_3$ or $CoWO_4$ are formed Step 2 (optional): Heat treatment at 500–900° C. in reducing atmosphere, for example comprising $H_2$, whereby the oxides are transformed into metals, for example W and $Co_7W_6$.

Step 3: Heat treatment at 1000–1400° C. in vacuum or in Ar such that eta phase is formed.

Such oxidation treatment is more suitable for the WC—Co grades, or grades with low gamma phase content, i.e. <3 wt-%), due to the formation of stable Ti, Ta and Nb oxides.

Figure 2A:
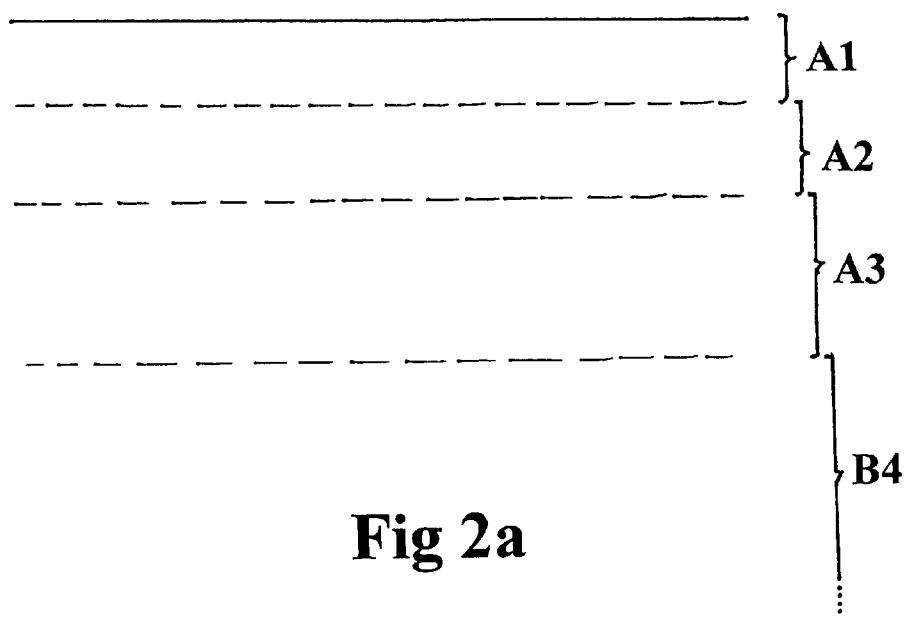
FIG. 2a is an illustration of surface zones formed according to the principles of the present invention.

As illustrated, for example, in FIG. 2a the decarburization treatment results in a surface zone A1 which consists of eta phase (or W and $Co_7W_6$). A zone A2 also exists which contains eta phase and WC. The amount of eta phase in A2 is less than in A1. In case of weaker decarburization the A1 will not be present only A2.

If the decarburized zone mainly comprises eta phase, the invention comprises a subsequent carburizing step following the initial decarburization. In this step the eta phase is completely transformed into WC+Co. The carburizing treatment comprises heat treatment for 20 min-10 h, depending on the thickness of the eta phase layer, in an atmosphere of 0.5–10% preferably 2–4% $CH_4$ in $H_2$, preferably at atmospheric pressure and at a temperature of 1275–1340° C., preferably 1320–1340° C. A preferred process involves carburizing the cemented carbide bodies on a carbon free support or on graphite support provided with $ZrO_2$—$Y_2O_3$ coatings. When graphite support is used and the decarburized zone comprises W phase, the W phase is transformed directly to WC using the graphite support as carbon source. No WC platelets are formed in this case since no eta phase is present before carburization.

The carburizing heat treatment preferably performed in a $H_2+CH_4$ gasatmosphere results in a surface zone B1 of thickness up to 100 μm, preferably 5–50 μm thick, which zone contains essentially triangular WC platelets. The size of the platelets is mainly governed by the thickness of A1 and A2. Thicker A1+A2 gives larger platelets.

Figure 1A:
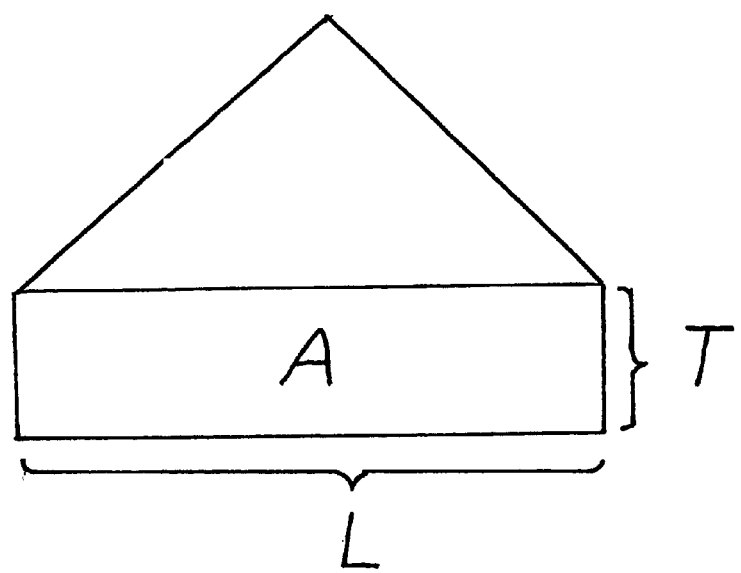
FIG. 1a shows a triangular WC platelet.
Figure 1B:
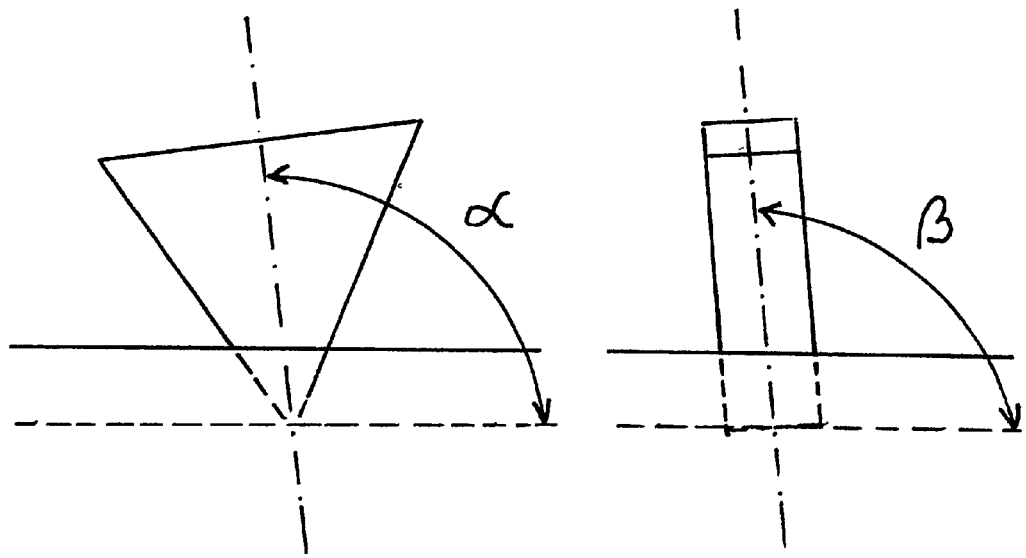
FIG. 1b shows the orientation of a platelet with respect to the surface of the body.

As illustrated in FIG. 1a and FIG. 1b, the triangular platelets have a length L, a thickness T, and an area A. The platelets are oriented at angles α and β relative to the surface plane.

To a certain extent the WC platelets are partially intergrown into each other. The WC platelets are present on at least 30%, preferably more than 50% and most preferably more than 75% of the surface of the cemented carbide body.

At least 30% of the WC platelets, preferably more than 50% have a length(L):thickness (T) ratio larger than 2:1, more preferably larger than 3:1. The average size of the platelets is length L<=50 μm, preferably L<=10 μm, but L>=2 μm. Preferably, the WC platelets protrude above the level of the surface by ⅕–⅘ of their length.

In a preferred embodiment, the majority of the WC platelets are oriented so that the angles α and β as defined in FIG. 1b are within 90±45° for at least 30%, of the platelets.

Based on XRD diffraction measurements, a Texture Coefficient, TC, can be defined as:

$$TC(hkl)=I(hkl)/I_o(hkl)\{1/n\Sigma I(hkl)/I_o(hkl)\}^{-1}$$

where

I(hkl)=measured intensity of the (hkl) reflection $I_o$(hkl)=standard intensity of the ASTM standard powder pattern diffraction data n=number of reflections used in the calculation, (hkl)

WC reflections used are:
001, 100, 101, 110, 002, 111, 200, 102

Furthermore, a texture coefficient ratio (TCR) can be defined such that:

$$TCR(100:001)=TC(100):TC(001)$$

According to the invention the average WC texture coefficient ratio TCR(100:001), calculated from at least 10 randomly related bodies is larger than 1.75, preferably larger than 2.0, more preferably larger than 2.5 and most preferably larger than 3.0.

Several binder phase gradients are possible.

In a first embodiment the binder phase gradient is obtained by a treatment at 1200–1330° C. for 0.5 h in vacuum, then at 1330–1375° C., for 0.2 h to 1 h in $CH_4+H_2$ atmosphere, using an eta phase containing body with A1+A2 having a thickness of 5–50 μm. After carburizing treatment, the binder phase content in zone B1 increases from <20% of the nominal content up to <70% in zone B2 and further up to a maximum of >10% above the nominal binder phase content in zone B3. The total thickness of B1+B2+B3 is 25–500 μm. An example of the binder phase distribution is shown in FIG. 6a.

Another preferred embodiment is obtained by heat treatment at 1200–1330° C. for ½ h in vacuum, then at 1320–1340° C. for 0.2–1 h in $CH_4+H_2$, using an essentially stoichiometric WC—Co body with A1+A2 having a thickness of 5–20 μm. The binder phase content for the carburized body increases from <20% of the nominal content in B1 to >10% of the nominal binder phase content in B2 and in B3 up to 5–10% less than the nominal binder phase content within at distance of 5–300 μm. An example of the binder phase distribution is shown in FIG. 6b.

Yet another preferred embodiment is obtained by heat treatment at 1200–1330° C. for 0.5 h in vacuum, then at 1320–1340° C. for 0.2–1 h in $CH_4+H_2$, using a WC—Co body with a stoichiometric carbon content up to that of free graphite. A1+A2 is 15–60 μm for a body with essentially or just below stoichiometric carbon content and 10–40 μm for a body with free graphite. In B1+B2 there is a maximum in binder phase content of more than 10% above the nominal binder phase content. In B3 the binder phase content is 10% lower than the nominal Co content. An example of the binder phase distribution is shown in FIG. 6c.

Yet another preferred embodiment is obtained by heat-treatment at 1320–1340° C. for 0.1–5 h in $CH_4+H_2$, using a body with a carbon content corresponding to an essentially stoichiometric or just below stoichiometric WC—Co. A1+A2 is 5–15 μm thick. The binder phase content in B1 is <20% of the nominal Co content. In B2 and B3 the Co content is somewhat lower or equal to the nominal Co content. B2+B3 can be up to 300 μm thick. An example of the binder phase distribution is shown in FIG. 6d.

A body according to the invention is coated with a wear resistant coating using any known coating method.

For the case of a diamond coated body according to the invention, there may exist phases in the region between the diamond layer and the body which contain binder metal combined with any of the elements B, Si, Al, C, N or combinations thereof, preferably Al and C. In a preferred embodiment said region contains the phases CoAl, $Co_3AlC_{0.5}$.

The size of the WC platelets should be selected with respect to the coating thickness. Preferably, the average platelet size is L<½ of the coating thickness.

Preferably, the WC grain size is <10 μm, and most preferably between 1 and 5 μm. The binder phase content shall be 4–12 wt-%. The binder phase should contain at least one of the following elements Co, Ni and Fe.

The bodies suited for growing WC platelets may consist of cemented carbide containing WC—Co, WC—Co-eta phase, WC—Co-graphite and WC—Co-cubic phase carbides, carbonitrides (usually solid solution phase of Ti, Ta, Nb,) with or without eta phase or graphite. If bodies comprising WC—Co-eta phase are used a 30 to 600 μm thick eta phase free zone will be formed close to the surface after carburizing heat treatment. The inner part of the body will however comprise an eta phase containing core. Gamma phase containing grades gradient sintered prior to decarburizing treatment with Co enriched surface zones between 5 and 50 μm can also be used. The WC platelets are more easily formed when carburizing is performed by carbon from external source ($CH_4$), besides $CH_4$, other carbon-hydrogen comprising gases can be used. However, sometimes WC platelets may also form using internal carbon source.

EXAMPLE 1

Cutting tool inserts SPUN120308 WC-6 wt-% Co, 20 vol-% eta phase) were oxidised for 2 minutes in air at 850–900° C. X-ray diffraction analysis of the insert surface showed the presence of $WO_3$ and $CoWO_4$ phases. The inserts were then heat treated at 1300° C. for 0.5 h in vacuum in order to obtain eta phase comprising zone, and finally carburized for 1 h at 1330° C. in an atmosphere of 2% $CH_4+H_2$. The insert surface consisted essentially of WC platelets of with a size L within 2.5–5 μm. At a position at the cutting edge the Co content increased from a level of <0.5 wt-% at the surface to a maximum of 40% above the nominal Co content at a depth of about 300 μm. Co distribution was similar to that shown in FIG. 6a. The eta phase free zone was between 200 to 450 μm thick.

The WC texture coefficient ratio TCR(100:001) measured at the surface was found to be 3.77.

Reference inserts, having WC and -6 wt-% Co-with the same eta phase content, were heat treated at 1300° C. for 0.5 h in vacuum, and then carburized for 1 h at 1330° C. in $H+CH_4$ atmosphere (according to U.S. Pat. No. 4,843,039). The WC texture coefficient ratio was TCR(100:001)=1.43.

Inserts from each of the groups were coated by an about 8 μm thick diamond coating in a DC arc plasma CVD coating process.

Five inserts of each of the groups from example 1 were tested in a machining test at the following conditions:

Material: Al 18%Si
Longitudinal turning, wet cutting
v=300 m/min
f=0.1 mm/rev
a=1.5 mm In this test the inserts according to the invention lasted 9 min without any visible wear while the reference inserts showed coating wear through after 7 min.

EXAMPLE 2

Cutting tool inserts VCGX160412 having WC and -6 wt-% Co-(25 vol-% eta phase) were oxidised for 3 minutes in air between 850 and 900° C. The X-ray diffraction analysis of the surf ace showed the presence of $WO_3$ and $CoWO_4$ phases. The inserts were heat treated at 1300° C. for 0.5 h in vacuum and then carburized for 1 h at 1330° C. in $H+CH_4$ atmosphere. The surface consisted of essentially WC platelets of with size L=6–10 μm. The Co content at the cutting edge increased from a level of <0.5 wt-% at the surface to a maximum of 25% above the nominal Co content at a depth of about 300 μm below the surface zone consisting of WC platelets. The WC texture coefficient ratio was TCR(100:001)=25.2.

The inserts were coated with a diamond layer with a thickness of 20 μm using a DC arc CVD plasma method.

Reference inserts were prepared as in Example 1 with TCR(100:001)=1.43.

The inserts were tested in a machining test at the following conditions:

Material: Al 9%Si
Facing of bearing component, wet cutting
rpm=2500 m/min
f=0.25 mm/rev
a=3 mm In this test the inserts according to the invention lasted 15 components without any visible wear while the reference inserts showed flaking after eight components.

EXAMPLE 3

Cutting tool inserts VCGX160412 of a WC and a-6 wt-% Co grade, without eta phase, were decarburized at 950° C. in $H_2+H_2O$ atmosphere for 6 hours. X-ray diffraction analysis of the insert surface showed the presence of W, $Co_7W_6$, $Co_6W_6C$ and WC phases. The inserts were heat treated at 1300° C. for 0.5 h in vacuum in order to transform W and $Co_7W_6$ phase to eta phase, and then in order to obtain WC platelets, carburized for 0.5 h at 1330° C. in $H_2+CH_4$ atmosphere containing 2 vol-% $CH_4$. In order to further decrease the Co content on the surface the inserts were electrochemically etched. Metallographic examination showed that the surface consisted of essentially WC platelets with size L=3–7 μm. The Co distribution was similar to that shown in FIG. 6b. The WC texture coefficient ratio was TCR(100:001)=14.

Reference inserts were prepared 1) as in Example 1, with TCR(100:001)=1.43 and 2) according to U.S. Pat. No. 4,843,039 using a 2.5 wt-% Co grade for which TCR (100:001)=1.25.

Ten inserts of each group were diamond coated to a layer thickness of 20 μm using a DC arc CVD plasma method.

The inserts were tested in a machining test at the following conditions:

Material: Al 9%Si, age hardened
Facing of bearing component, wet cutting
rpm=2500 m/min
f=0.7 mm/rev
a=3 mm In this test the inserts according to the invention successfully machined ten bearing components without any visible wear or cracking while the reference inserts of both types showed nose cracking after machining four components or less.

EXAMPLE 4

Cutting tool inserts were produced as in Example 3 except for decarburizing and carburizing step. Decarburizing was performed for 3 h at 950° C. in $H_2+H_2O$ atmosphere. The carburizing was performed for 20 minutes at 1330° C. in $H_2+CH_4$ atmosphere containing 2 vol-% CH4. The average length of the WC platelets was L=2–4 µm and TCR (100:001)=6.0. The inserts were coated by an about 20 µm thick TiAlN coating in a magnetron sputtering PVD process.

Two references were produced. The first reference, Reference No 1, was produced from the same grade as the reference in Example 1. The second reference, Reference No 2, was prepared from a grade with composition having WC and -6 wt-% Co without eta phase and with no decarburizing and carburizing treatment. The WC texture coefficient ratio was TCR(100:001)=0.58.

The inserts according to the invention showed good coating adhesion while spontaneous flaking of the coating was obtained for both references No 1 and No 2.

EXAMPLE 5

Five cutting tool inserts of style N151.2-300-5E were prepared according to example 4 but the applied layer was 10 µm CVD TiN—Ti(C,N)—TiN.

An improved adhesion was observed for the inserts according to the invention. The inserts were subject to a cutting tool life test using the parameters':

Material: SS2343
Grooving of bar
v=300 m/min
f=0.2 mm/rev
wet cutting

The inserts according to the invention were used for machining 30 grooves before edge-line flaking was observed while reference inserts prepared by the application of the same layer on a WC-6 wt-% Co grade, showed flaking after machining of ten grooves.

EXAMPLE 6

Cutting tool inserts of WC-6 wt-% Co grade, without eta phase and graphite were decarburized at 1250° C. in $H_2+H_2O$ atmosphere for 4 h. X-ray diffraction analysis of the insert surface showed the presence of the eta phase ($Co_6W_6C$ and $Co_2W_4C$). The inserts were carburized for 1 h at 1330° C. in $H_2+CH_4$ atmosphere containing 2 vol-% $CH_4$ (heating up to carburizing temperature was performed in vacuum). The insert surface consisted of WC platelets and Co. At the insert surface, the Co content was >50% of the nominal Co content as measured at the cutting edge. The average length of the WC platelets was L=5–10 µm. The Co rich zone containing WC platelets was about 40 µm thick. The Co distribution was similar to that shown in FIG. 6c.

The WC texture coefficient TCR(100:001)=61.6.
The inserts were electrochemically etched.
The inserts were coated with 10 µm CVD TiCN+5 µm $Al_2O_3$.

EXAMPLE 7

Cutting tool inserts of WC and -6 wt-% Co grade, without eta phase and graphite were decarburized for 10 h at 950° C. in $H_2+H_2O$ atmosphere. X-ray diffraction showed the presence of the W, $Co_7W_6$ and eta phase ($Co_6W_6C$). The inserts were heat treated at 1330° C. in vacuum and then carburized at 1330° C. for 0.5 h in an atmosphere containing 2 vol-% $CH_4$. The insert surface contained more than 50 vol-% WC platelets. The average length of the WC platelets was 5–10 µm. The Co content on the insert surface was <5% of the nominal Co content. The Co distribution was similar to that shown in FIG. 6d. The WC texture coefficient TCR (100:001)=4.15

Reference inserts were prepared from the same grade but without decarburizing and carburizing treatment as in Example 7. The WC texture coefficient TCR (100:001)= 1.23.

Ten inserts of each group were diamond coated to a layer thickness of 18 µm using a DC arc CVD plasma method.

EXAMPLE 8

Figure 2B:
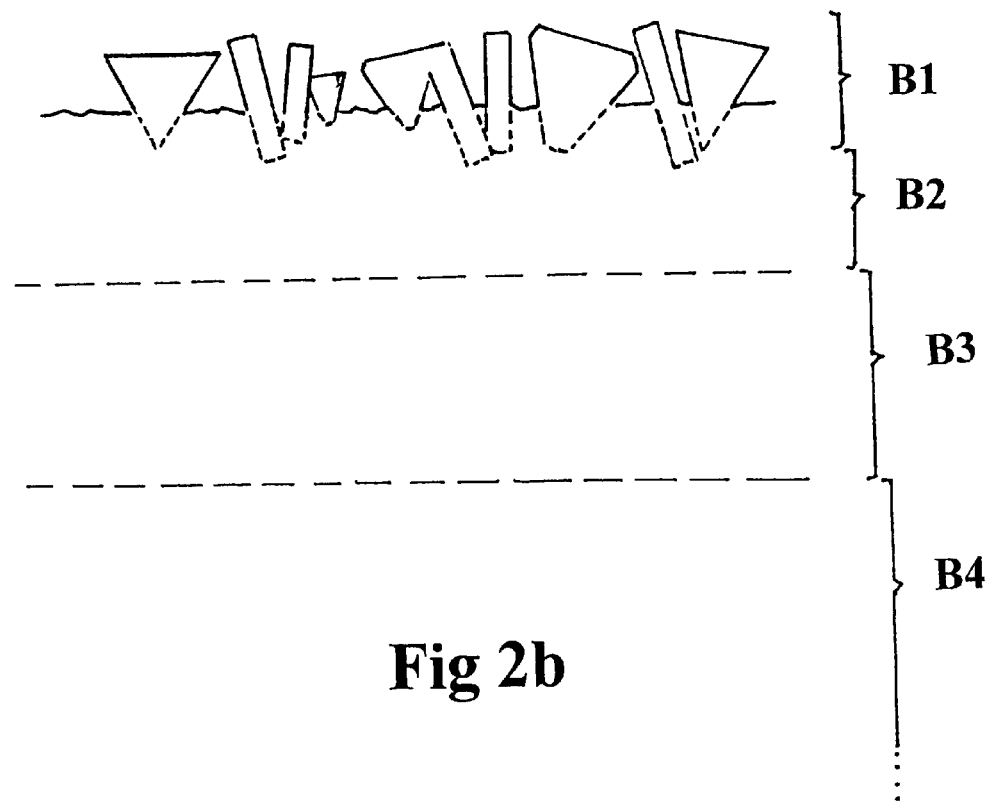
FIG. 2b is an illustration of various surface zones according to the present invention.
Figure 3A:
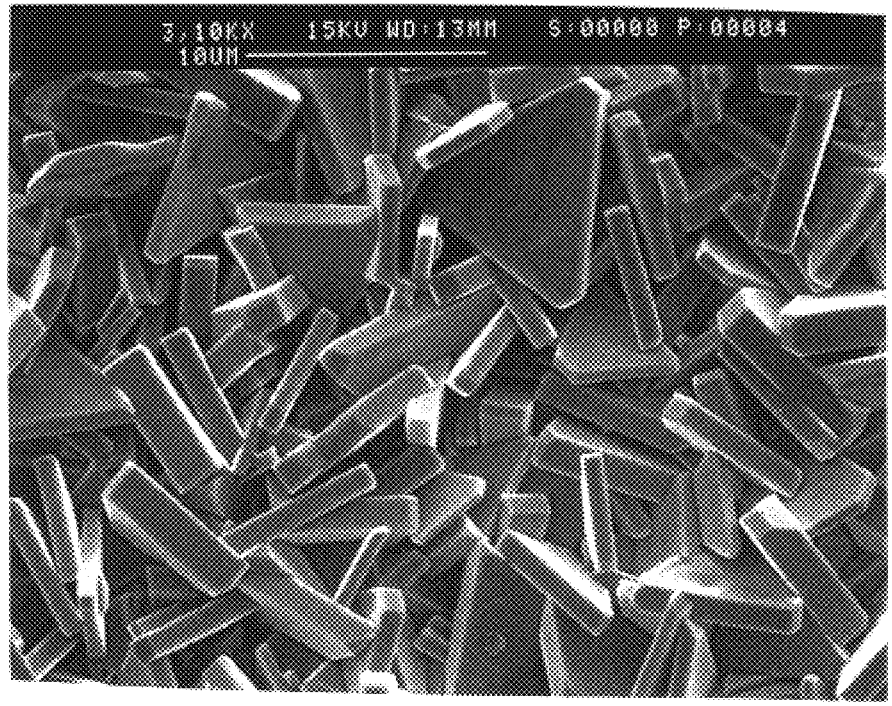
FIG. 3a shows in 3000X a scanning electron micrograph of an uncoated WC—Co cemented carbide surface according to the invention.
Figure 3B:
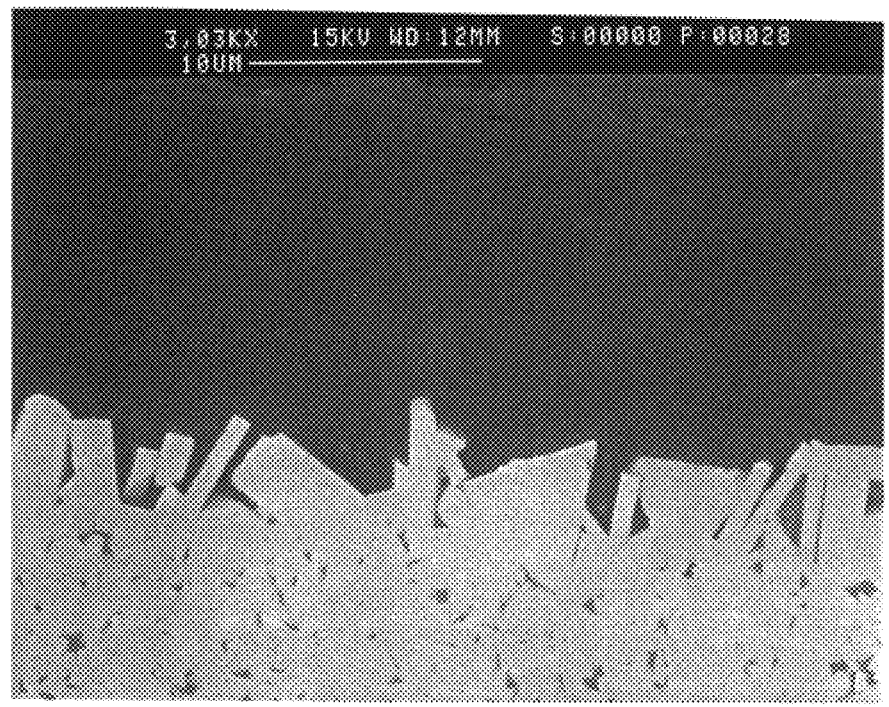
FIG. 3b shows in 3000X a scanning electron micrograph of a cross-section of the same body as in FIG. 3a coated with a diamond layer.
Figure 4A:
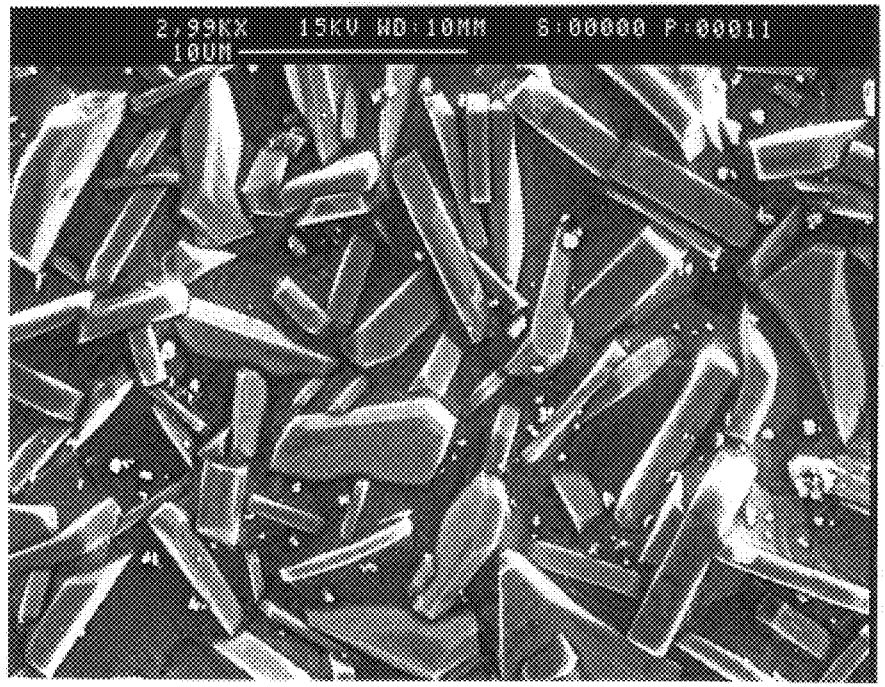
Figure 4B:
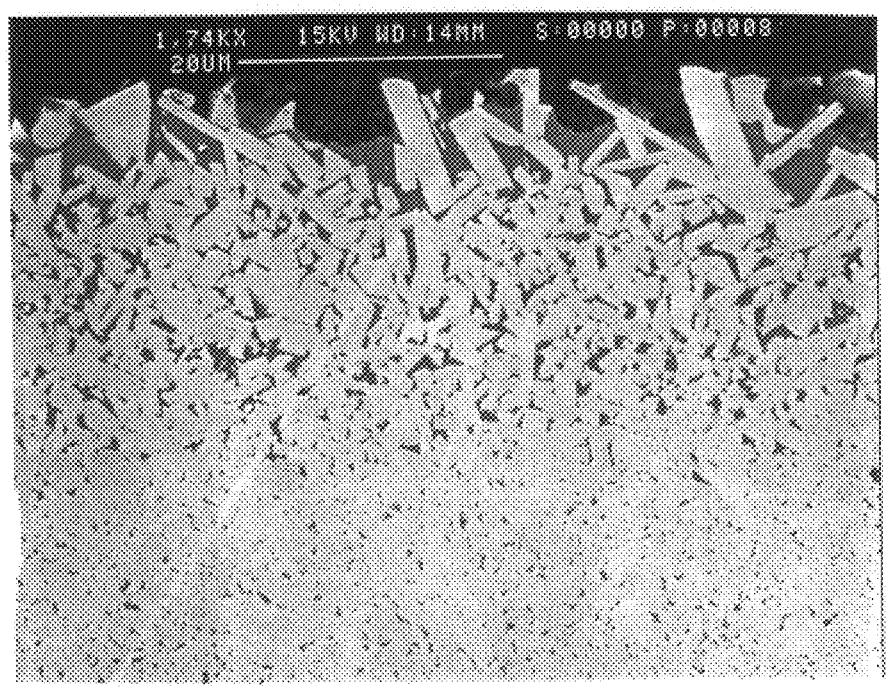
Figure 5A:
FIG. 5a shows in 3000X a scanning electron micrograph of an uncoated cemented carbide surface of a WC—Co-gamma phase grade according to the invention.
Figure 5B:
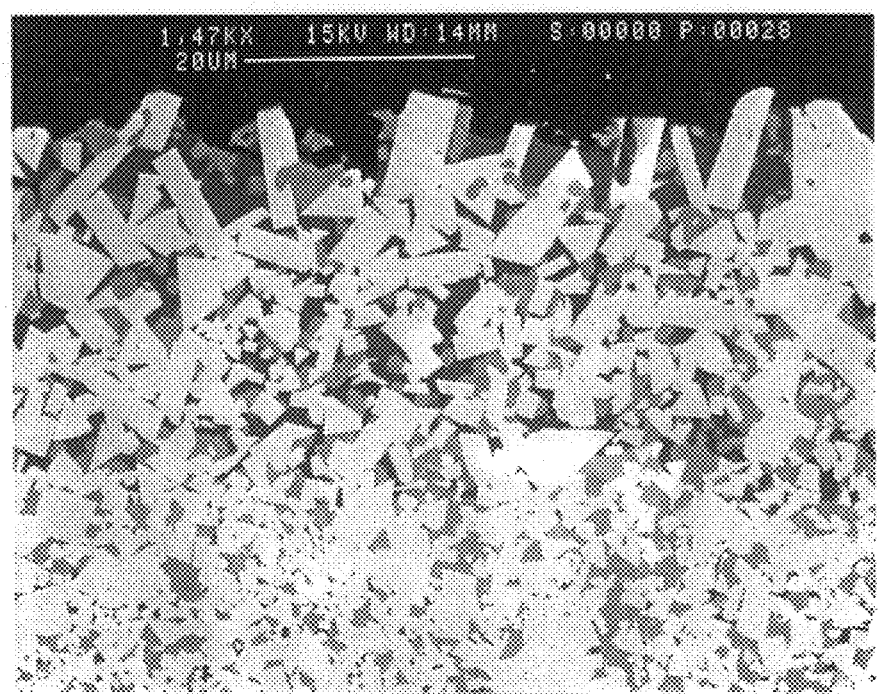

Cutting tool inserts of a WC and -6 wt-% Co grade containing free graphite were decarburized at 950° C. in $H_2+H_2O$ atmosphere for 4 hours. The X-ray diffraction analysis of the insert surface showed the presence of W, $Co_7W_6$, $Co_6W_6C$ and WC phases. The inserts were heat treated at 1300° C. for 0.5 h in vacuum and then carburized for 1.0 h at 1330° C. in $H_2+CH_4$ atmosphere. The surface consisted of 30–40 vol-% WC platelets of with size L=5–10 µm. The Co content in zone B1 (see FIG. 2b) was >100% of the nominal value and the width of the zone was 50 µm. The texture coefficient ratio TCR(100:001)=11.2. The inserts were coated with 7 µm thick TiN+Ti(C,N)+5 µm $Al_2O_3$.

EXAMPLE 9

Cutting tool inserts of a composition 86 wt-% WC, 5.8 wt-% Co, 3.5 wt-% TiC, 2.3 wt-% TaC and 3.5 wt-% NbC without eta phase or graphite were decarburized at 1250° C. in $H_2+H_2O$ atmosphere for 4 hours. X-ray diffraction analysis showed presence of W, $Co_7W_6$, eta phase and cubic carbide phase (gamma phase). The inserts were heat treated in vacuum at 1330° C. for 0.5 h and then carburized for 1 hour at 1330° C. in $H_2+CH_4$ atmosphere containing 2 vol-% $CH_4$. The cutting edge consisted of essentially WC platelets of with size L=10–20 µm. Minor amounts of gamma phase and Co were present at the surface. There was an enrichment of Co of >50% of the nominal Co content within a 25 µm thick zone, B1, close to the surface. The WC texture coefficient ratio was TCR(100:001)=23.6. The inserts were coated with a 10 µm TiN—Ti (C,N) layer+8 µm $Al_2O_3$ layer.

The principles, preferred embodiments and mode of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A body of cemented carbide comprising 4–12 wt-% binder phase coated with at least one wear resistant layer, the body comprises a surface zone with a thickness up to 100 $\mu$m, the zone comprises essentially triangular WC platelets having a texture coefficient ratio >1.75.

2. The body according to claim 1 wherein said WC platelets show a length [L] to thickness [T] ratio of >2:1, an average length $\leq$30 $\mu$m, but larger than 2 $\mu$m and, the platelets protrude above the level of the surface by 1/5–4/5 of their length.

3. The body according to claim 1, comprising an average binder phase content which increases from <20% of the nominal binder phase content in a first zone B1 up to a maximum of >10% above the nominal binder phase content in a second zone B3 at a depth of 50–500 $\mu$m.

4. The body according to claim 1, comprising an average binder phase content which increases from <20% of the nominal binder phase content in a first zone B1 up to at least nominal binder phase content or higher in a second zone B2 and then decreases to a minimum of >50% of the nominal binder phase content in a third zone B3 at a depth of 5–500 $\mu$m.

5. The body according to claim 1, wherein the binder phase concentration in the zone B1 is >20% of the nominal binder phase content and for zone B2 of width 5–100 $\mu$m there exists a maximum of +50 vol-% of the nominal binder phase content.

6. The body according to claim 1, comprising an average binder phase concentration in a first zone B1 which is <20% of the nominal binder phase content, and second and third zones B2 and B3 of width 0–500 $\mu$m have a Co level within ±10% of the nominal binder phase content.

7. The body according to claim 1, wherein the wear resistant layer is a CVD diamond layer.

8. The body according to claim 7, further comprising phases in the region between the diamond layer and the carbide body which contain binder metal combined with any of the elements B, Si, Al, C, N or combinations thereof.

9. The body of claim 1, wherein the texture coefficient ratio is <2.0, and the length to thickness ratio is 3:1.

10. The body of claim 1, wherein the texture coefficient ratio is <2.5, and the length to thickness ratio is 5:1.

11. The body of claim 1, wherein the texture coefficient ratio is >3.0.

12. The body of claim 2, wherein the average length is $\leq$10 $\mu$m, but larger than 2 $\mu$m.

13. The body of claim 8, wherein the binder metal is combined with Al and C.

14. The body of claim 8, wherein the region between the diamond layer and the carbide body comprises the phases CoAl and $Co_3AlC_{0.5}$.

15. A method for producing a diamond coated cemented carbide body with a surface zone in the cemented carbide being different from the rest of the carbide body the method comprising:

decarburizing the body to form an eta phase containing surface zone 3–100 $\mu$m thick and comprising >60% by volume of at least partially interconnected eta phase and recarburizing the body whereby the eta phase is completely transformed into WC+Co.

16. The method according to claim 15 wherein the decarburization is made by heating the body to a temperature between 900 and 1350° C., preferably between 950 and 1250° C., in a decarburizing atmosphere, such as $H_2+H_2O$, for 1–10 h.

17. The method according to claim 15 wherein the decarburization treatment comprises:

step 1: T=500–900° C. in air whereby oxides such as $WO_3$ or $CoWO_4$ are formed step 2: T=1000–1400° C. in vacuum such that eta phase is formed which treatment results in a first surface zone A1 which comprises at least one of eta phase+WC or eta phase only.

18. The method according to claim 15, further comprising carburizing the body for 10 min-10 h in an atmosphere of 0.5–10% $CH_4$ in $H_2$, and at a temperature of 1250–1340° C.

19. The method of claim 15, wherein the surface zone comprises a $W+Co_7W_6$ phase, and after the decarburizing step the body is heat treated to transform the $W+Co_7W_6$ phase to eta phase.

20. The method of claim 17, further comprising, between steps 1 and 2:

treating the body at a temperature T=500–900° C. in a reducing atmosphere, whereby oxides are transformed into metals.

21. The method of claim 20, wherein the reducing atmosphere comprises $H_2$.

22. The method of claim 17, wherein step 2 further comprises treating the body such that a second surface zone A2 is formed in the body and the second surface zone comprises eta phase and WC in different amounts relative to the first surface zone A1.

23. The method of claim 18, wherein the atmosphere comprises 2–4% $CH_4$.

24. The method of claim 18, wherein the temperature is 1315–1330° C.

* * * * *